US011107550B2

(12) United States Patent
Xie et al.

(10) Patent No.: US 11,107,550 B2
(45) Date of Patent: Aug. 31, 2021

(54) SELF-ADAPTIVE READ VOLTAGE ADJUSTMENT USING BOUNDARY ERROR STATISTICS FOR MEMORIES WITH TIME-VARYING ERROR RATES

(71) Applicant: Micron Technology, Inc., Boise, ID (US)

(72) Inventors: Tingjun Xie, Milpitas, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 16/510,483

(22) Filed: Jul. 12, 2019

(65) Prior Publication Data
US 2021/0012857 A1    Jan. 14, 2021

(51) Int. Cl.
*G11C 29/50* (2006.01)
*G06F 11/07* (2006.01)

(52) U.S. Cl.
CPC ...... *G11C 29/50004* (2013.01); *G06F 11/073* (2013.01); *G11C 29/50012* (2013.01); *G11C 2029/5004* (2013.01)

(58) Field of Classification Search
None
See application file for complete search history.

(56) References Cited

U.S. PATENT DOCUMENTS 9,818,488 B2 * 11/2017 Sankaranarayanan ...... G06F 11/1048
10,101,931 B1 10/2018 Camp et al.
10,783,978 B1 9/2020 Chen et al.
(Continued)

FOREIGN PATENT DOCUMENTS

WO    2015048037 A1    4/2015

OTHER PUBLICATIONS

International Search Report and Written Opinion for International Application No. PCT/US2020/040567, dated Oct. 8, 2020, 10 pages.

*Primary Examiner* — April Y Blair
*Assistant Examiner* — Matthew W Wahlin
(74) *Attorney, Agent, or Firm* — Lowenstein Sandler LLP

(57) ABSTRACT

A processing device in a memory system identifies a first range of a plurality of write-to-read delay ranges for the memory component, wherein the first range represents a plurality of write-to-read delay times and has an associated read voltage level used to perform a read operation on a segment of the memory component having a write-to-read delay time that falls within the first range. The processing device further identifies a first set of the plurality of write-to-read delay times at a first end of the first range and a second set of the plurality of write-to-read delay times at a second end of the first range, and determines a first error rate for the memory component corresponding to the first set of the plurality of write-to-read delay times and a second error rate for the memory component corresponding to the second set of the plurality of write-to-read delay times. The processing device determines whether a correspondence between the first error rate and the second error rate satisfies a first threshold criterion, and, responsive to the correspondence between the first error rate and the second error rate not satisfying the first threshold criterion, modifies the read voltage level associated with the first range.

20 Claims, 10 Drawing Sheets

(56) References Cited

U.S. PATENT DOCUMENTS

| | | |
|---|---|---|
| 10,790,036 B1 | 9/2020 | Zhou et al. |
| 2013/0132652 A1 | 5/2013 | Wood et al. |
| 2014/0241082 A1 | 8/2014 | Tam |
| 2016/0266973 A1 | 9/2016 | Abe |
| 2016/0276011 A1 | 9/2016 | Houssameddine |
| 2017/0358369 A1 | 12/2017 | Chinnakkonda Vidyapoornachary et al. |

\* cited by examiner

SELF-ADAPTIVE READ VOLTAGE ADJUSTMENT USING BOUNDARY ERROR STATISTICS FOR MEMORIES WITH TIME-VARYING ERROR RATES

TECHNICAL FIELD

Embodiments of the disclosure relate generally to memory sub-systems, and more specifically, relate to self-adaptive read voltage adjustment using boundary error statistics for memories with time-varying error rates.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
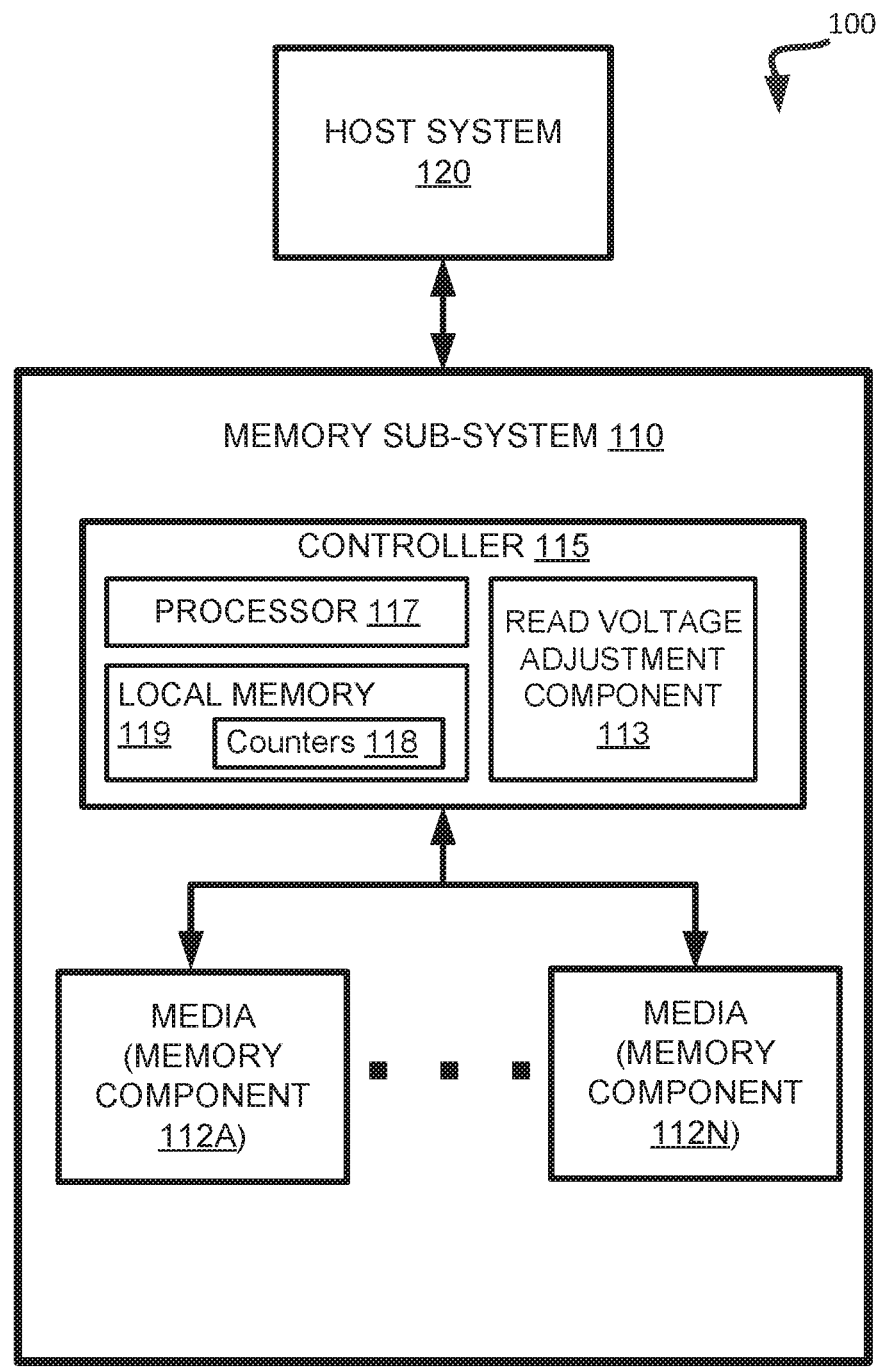
FIG. 1 illustrates an example computing environment that includes a memory sub-system in accordance with some embodiments of the present disclosure.

Aspects of the present disclosure are directed to self-adaptive read voltage adjustment for memories in a memory sub-system with time-varying error rates. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A memory sub-system can include multiple memory components that can store data from the host system. Depending on the implementation, each memory component can include either the same or a different type of media. Examples of media include, but are not limited to, a cross-point array of non-volatile memory and flash based memory such as single-level cell (SLC) memory, multi-level cell (MLC) memory, triple-level cell (TLC) memory, or quad-level cell (QLC) memory. The characteristics of different types of media can vary from one media type to another. One example of a characteristic associated with a memory component is data density. Data density corresponds to an amount of data (e.g., bits of data) that can be stored in each memory cell of a memory component. Using the example of a flash based memory, QLC memory can store four bits of data while SLC memory can store one bit of data. Accordingly, a memory component including QLC memory cells will have a higher data density than a memory component including SLC memory cells. Another example of a characteristic of a memory component is access speed. The access speed corresponds to an amount of time for the memory component to access data stored at the memory component.

Other characteristics of a memory component can be associated with the endurance of the memory component to store data. When data is written to and/or erased from a memory cell of a memory component, the memory cell can be damaged to some extent. As the number of write operations and/or erase operations performed on a memory cell increases, the probability of the data stored at the memory cell including an error increases, and the memory cell is increasingly damaged. A characteristic associated with the endurance of the memory component is the number of write operations or a number of program/erase operations performed on a memory cell of the memory component. An increasing number of read and write operations can result in a higher error rate of the data stored at the memory cell. This can increase the use of error recovery operations, which includes but is not limited to read retry (i.e. sensing the memory component again) and RAID (redundant array of independent disks) for subsequent data operations (e.g., read and/or write) performed on the memory cell. The increased use of the error recovery operations can result in a reduction of the performance of a conventional memory sub-system. In addition, as the error rate for a memory cell or data block continues to increase, it may even surpass the error recovery capabilities of the memory sub-system, leading to an irreparable loss of the data. Furthermore, as more resources of the memory sub-system are used to perform the error recovery operations, fewer resources are available to perform other read operations or write operations.

Therefore, upon a threshold number of read and/or write operations being performed on the data block, the memory sub-system can perform a data integrity check (also referred to herein as a "scan") to verify that the data stored at the data block remain at an adequate reliability level. During the data integrity check, a collection of read and/or write operations is invoked and one or more reliability statistics are determined for data stored at the data block. One example of a reliability statistic is a raw bit error rate (RBER). The RBER can be defined as the ratio of the number of erroneous bits to the number of all data bits stored in the data block.

For certain memory types (i.e., for memory sub-systems employing certain types of storage media), the error rate can vary over time. In particular, some non-volatile memories (e.g., NAND, phase change, etc.) have threshold voltage (Vt) distributions that move as a function of time. At a given read level (i.e., the voltage applied to a memory cell as part of a read operation), if the Vt distributions move, then the RBER can also be affected. For any Vt distribution at an instance in time, there can be an optimal read level (or read level range) that minimizes the expected RBER. In particular, the Vt distribution and RBER can be a function of write-to-read (W2R) delay (i.e., the period of time that passes between when data is written to a memory component and when the data is read from the memory component). Due to this time-varying nature of RBER, as well as other noise mechanisms in memory, a single read level may not be sufficient to achieve an error rate that satisfies certain system reliability targets. Thus, certain memory sub-systems may have a number of pre-programmed read voltage levels, each corresponding to a different range of W2R delay times. For example, a first read voltage level may be used to read data having a W2R delay time that falls within a first corresponding range, while a second read voltage level may be used to read data having a W2R delay time that falls within a second corresponding range, and so on.

In many conventional memory sub-systems, the read voltage levels utilized for each range of W2R delay times are pre-programmed and never adjusted during usage of the underlying memory components. These pre-programmed read voltage levels may not be set at optimal values during production or may not remain optimal over the life of the memory component, leading to increased error rates. For example, Vt distributions can be constantly affected by disturbances of self or neighboring cells, circuitry noise, temperature, etc., which implies optimal read voltages should also change accordingly. It is also possible that the optimal read voltages can gradually shift over time due to wear on the memory cells and changes to the physical and/or electrical characteristics of the memory cells. The use of sub-optimal read voltage levels can lead to partial write effects, increased RBER, and a high read-retry trigger rate. This can result in a decrease of performance of the memory sub-system, as well as an increase in the power consumption of the memory sub-system. System bandwidth and other resources can also be tied up for extended periods of time, preventing the use of those resources for other functionality.

Aspects of the present disclosure address the above and other deficiencies by utilizing a self-adaptive on-the-fly read voltage adjustment scheme based on accumulated boundary RBER statistics for memories with time-varying error rates. In one implementation, the memory sub-system identifies a first range of multiple write-to-read delay ranges for a memory component, wherein the first range represents a plurality of write-to-read delay times and has an associated read voltage level used to perform a read operation on a segment of the memory component having a write-to-read delay time that falls within the first range. The memory sub-system further identifies a first set of the plurality of write-to-read delay times at a first end of the first range (i.e., at a first boundary) and a second set of the plurality of write-to-read delay times at a second end of the first range (i.e., at a second boundary) and determines a first error rate for the memory component corresponding to the first set of write-to-read delay times and a second error rate for the memory component corresponding to the second set of write-to-read delay times. The memory sub-system determines whether a correspondence between the first error rate and the second error rate (e.g., a ratio of the first error rate to the second error rate, a difference between the first error rate and the second error rate, etc.) satisfies a first threshold criterion, which for example, can be based on desired reliability and performance characteristics of the memory sub-system. If the correspondence between the first error rate and the second error rate satisfies the first threshold criterion, the memory sub-system can maintain the read voltage level at a current level. Alternatively, responsive to the correspondence between the first error rate and the second error rate not satisfying the first threshold criterion, the memory sub-system can modify the read voltage level associated with the first range as needed.

The read voltage adjustment scheme described herein allows for adjustment of production trim values that may have been originally set sub-optimally or may have become sub-optimal over time. Adjusting the read voltage levels used for different ranges of W2R delay times can minimize the harmful effects of various disturbances on the memory component and reduce the read-retry trigger rate, thereby improving throughput and latency in the memory sub-system. In addition, read voltage adjustment can diminish the partial write effect and lower the risk of the memory sub-system being unable to meet reliability targets of the host system. Finally reducing the RBER can increase performance, decrease power consumption associated with error correction/recovery operations and free system resources for other functionality. The memory controller can be utilized for less time for performing error recovery operations, thereby allowing more time for the controller to handle other data access operations for the memory component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data. The data blocks can be further grouped into one or more planes on each of memory components 112A to 112N, where operations can be performed on each of the planes concurrently. Corresponding data blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, counters 118, etc. The local memory 119 can also include read-only memory (ROM) for storing microcode. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a read voltage adjustment component 113 that can be used to perform boundary RBER calculations and adjust the read voltage level(s) for the data blocks of memory components 112A to 112N. In one embodiment, read voltage adjustment component 113 identifies a first range of a plurality of write-to-read delay ranges for a memory component, such as one of memory components 112A to 112N. The first range represents a plurality of write-to-read (W2R) delay times and has an associated read voltage level used to perform a read operation on a segment of the memory component having a W2R delay time that falls within the first range. Read voltage adjustment component 113 can further identify a first set of the plurality of write-to-read delay times at a first end of the first range (i.e., at a first boundary) and a second set of the plurality of write-to-read delay times at a second end of the first range (i.e., at a second boundary) and determine a first error rate for the memory component corresponding to the first set of the plurality of write-to-read delay times and a second error rate for the memory component corresponding to the second set of the plurality of write-to-read delay times. Read voltage adjustment component 113 can determine whether a correspondence between the first error rate and the second error rate satisfies a first threshold criterion, which for example, can be based on desired reliability and performance characteristics of the memory sub-system. If the correspondence satisfies the first threshold criterion, read voltage adjustment component 113 can maintain the read voltage level at a current level. Responsive to the correspondence between the first error rate and the second error rate not satisfying the first threshold criterion, however, read voltage adjustment component 113 can modify the read voltage level associated with the first range, as needed, such as to bring the correspondence (e.g., ratio) within a threshold amount of a target ratio defined by the first threshold criterion. Further details with regards to the operations of the read voltage adjustment component 113 are described below.

Figure 2:
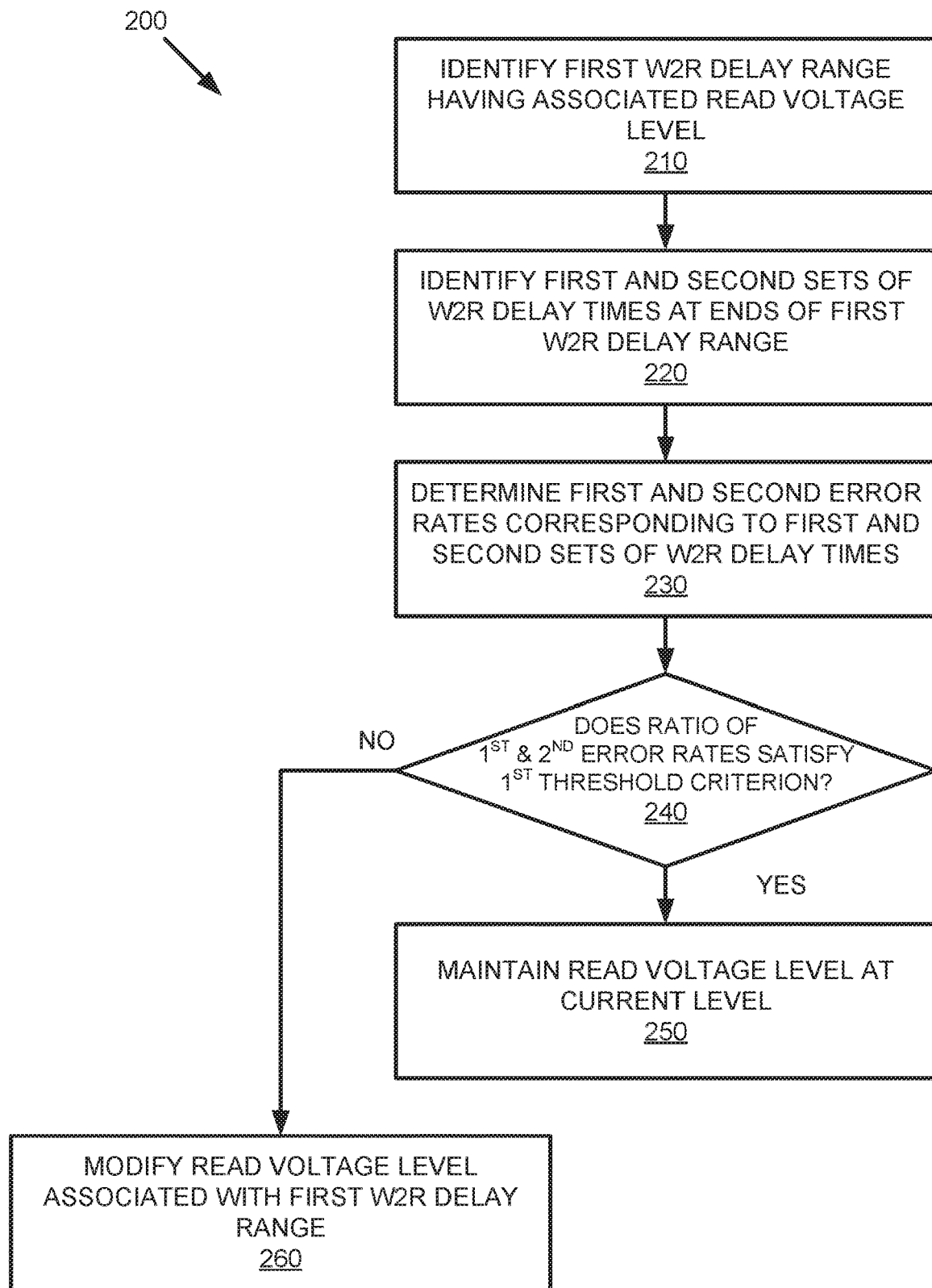
FIG. 2 is a flow diagram of an example method of adjusting a read voltage level based on accumulated boundary RBER statistics for memories with time-varying error rates in accordance with some embodiments of the present disclosure.

FIG. 2 is a flow diagram of an example method of adjusting a read voltage level based on accumulated boundary RBER statistics for memories with time-varying error rates in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 3A:
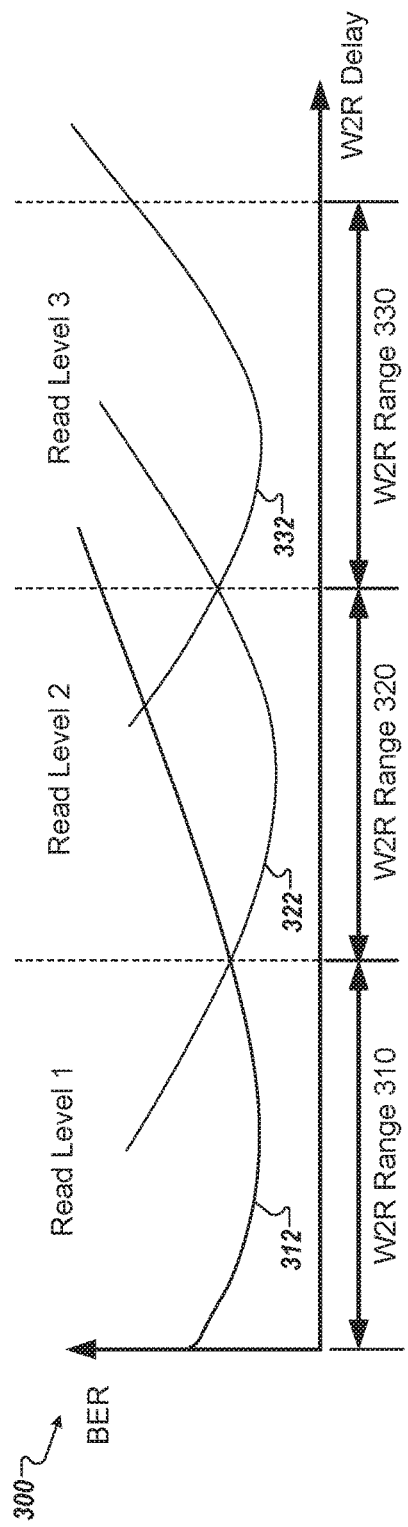
FIG. 3A is a graph that illustrates the bit error rate as a function of write-to-read delay for three read voltage levels in accordance with some embodiments of the present disclosure.

At operation 210, the processing logic identifies a first range (e.g., W2R Range 310) of a plurality of write-to-read delay ranges for the memory component, wherein the first range represents a plurality of write-to-read delay times and has an associated read voltage level (e.g., Read Level 1) used to perform a read operation on a segment of the memory component having a write-to-read delay time that falls within the first range, as shown in FIG. 3A. FIG. 3A is a graph 300 that illustrates the bit error rate (BER) as a function of write-to-read (W2R) delay for three read voltage levels in accordance with some embodiments of the present disclosure. As described herein, Vt distributions can shift over time. For example, for a given read voltage level, such as a first read voltage level (labeled Read Level 1), the bit error rate experienced when read operations are performed using this read voltage level can change as a function of time due to the move of Vt distributions. Similarly, the corresponding bit error rates of the second read voltage level (labeled Read Level 2) or the third read voltage level (labeled Read Level 3) also change as a function of time. In these or other situations, the Vt distribution and bit error rate can be a function of the W2R delay. Graph 300 shows that each of the three read voltage levels correspond to a different range of W2R delay times, such as W2R Range 310, W2R Range 320, and W2R Range 330, which can be design targets from memory sub-system specifications. In other embodiments, there may be any other number of ranges of W2R delay times and associated read voltage levels. In graph 300, the measured BER is displayed for read operations performed using a designated read voltage level. For example, BER curve 312 represents the BER measured for read operations performed using Read Level 1 on segments of different W2R delay times, BER curve 322 represents the BER measured for read operations performed using Read Level 2 on segments of different W2R delay times, and BER curve 332 represents the BER measured for read operations performed using Read Level 3 on segments of different W2R delay times. It is evident from graph 300 that using Read Level 1 results in a lower BER for read operations performed on segments of the memory component having W2R delay times that fall within W2R Range 310, using Read Level 2 results in a lower BER for read operations performed on segments of the memory component having W2R delay times that fall within W2R Range 320, and using Read Level 3 results in a lower BER for read operations performed on segments of the memory component having W2R delay times that fall within W2R Range 330. Graph 300 also illustrates that for a single read level (e.g., Read Level 2) the BER increases at lower W2R delay times (i.e., W2R Range 310) and at higher W2R delay times (i.e., W2R Range 330). The values of Read Level 1, Read Level 2, and Read Level 3 may be set during production of the memory component, but due to the passage of time and other factors associated with use of the memory component, may become suboptimal at some point. Adjusting the read voltage levels based on accumulated boundary RBER statistics can bring those read voltage levels back to a point where the BER is optimized (or at least reduced) for a corresponding range of W2R delay times.

Figure 3B:
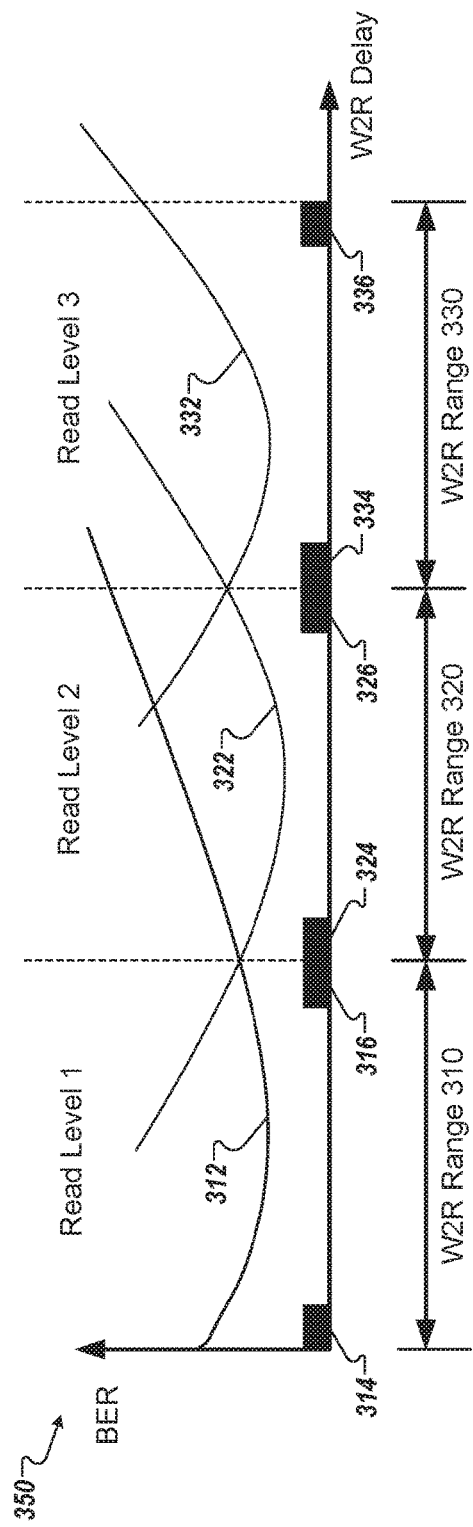
FIG. 3B is a graph that illustrates the accumulated boundary raw bit error rate statistics for memories with time-varying error rates in accordance with some embodiments of the present disclosure.

Referring again to FIG. 2, at operation 220, the processing logic identifies a first set 314 of the plurality of write-to-read delay times at a first end (i.e., boundary) of the first range (i.e., W2R Range 310) and a second set 316 of the plurality of write-to-read delay times at a second end (i.e., boundary)

of the first range, as illustrated in FIG. 3B. FIG. 3B is a graph 350 that illustrates the accumulated boundary RBER statistics for memories with time-varying error rates in accordance with some embodiments of the present disclosure. In one implementation, the first set 314 includes a small set of the lowest W2R delay times in W2R Range 310 and the second set includes a small set of the highest W2R delay times in W2R Range 310. W2R Range 320 may similarly have a first set 324 and a second set 326, and W2R Range 330 may have a first set 334 and a second set 336. The size of the first set 314 and the second set 316 can be a configurable parameter and can include a fixed number of W2R delay times (e.g., the 5 lowest W2R delay times or the 5 highest W2R delay times in W2R Range 310) or a percentage of all the W2R delay times in W2R Range 310 (e.g., the lowest 1% or the highest 1%). In one implementation, the boundary between W2R Range 310 and W2R Range 320 can be set according to a point where curve 312 and curve 322 intersect, and the boundary between W2R Range 320 and W2R Range 330 can be set according to a point where curve 322 and curve 332 intersect. Since the error rates can change over time due to physical changes to the associated memory cells, wear level, temperature, etc., these boundaries can also shift over time in order to optimize the BER. In addition, changing system design targets can also impact the location of these boundaries.

Referring again to FIG. 2, at operation 230, the processing logic determines a first error rate for the memory component corresponding to the first set 314 of the plurality of write-to-read delay times and a second error rate for the memory component corresponding to the second set 316 of the plurality of write-to-read delay times. In one implementation, read voltage adjustment component 113 performs a data integrity scan of the memory component to determine an error rate for each segment (e.g., a data block). During the scan, read voltage adjustment component 113 identifies one or more reliability statistics, such as the raw bit error rate (RBER) defined as the ratio of the number of erroneous bits to the number of all data bits stored in the data block. In one embodiment, during the scan, read voltage adjustment component 113 writes and reads a raw code word (i.e., a series of a fixed number of bits) from the data block, with a controlled W2R delay falling into either the first set 314 or the second set 316. Read voltage adjustment component 113 can apply the raw code word to an error correcting code (ECC) decoder to generate a decoded code word and compare the decoded code word to the raw code word. Read voltage adjustment component 113 can count a number of flipped bits between the decoded code word and the raw code word, with a ratio of the number of flipped bits (i.e. erroneous) to the total number of bits in the code word representing the RBER. Read voltage adjustment component 113 can repeat this process for additional code words with a W2R delay uniformly distributed over 314 and 316 until the entire block has been scanned. In another implementation, read voltage adjustment component 113 can utilize various counters 118 to determine the error rate, as described in more detail with respect to FIG. 4.

At operation 240, the processing logic determines whether a correspondence between the first error rate and the second error rate satisfies a first threshold criterion. In one implementation, read voltage adjustment component 113 determines a ratio of the first error rate to the second error rate and compares that ratio to a target ratio. In one implementation, the target ratio may be one, such that it is desirable for the first error rate to be as close as possible to the second error rate. Accordingly, read voltage adjustment component 113 can compare the first error rate to the second error rate and determine whether the first error rate is within a threshold amount of the second error rate. If the ratio is sufficiently close to one (i.e., if the difference between the first error rate and the second error rate is within the threshold amount), read voltage adjustment component 113 can determine that the threshold criterion is satisfied. In other implementations, the target ratio may be some other value set in view of desired reliability and performance requirements of the memory sub-system. For example, in some situations, it may be preferred that one certain read level is to be optimized based on the whole W2R range of the memory sub-system. In another implementation, it may be desirable that the first error rate at the first boundary of a certain W2R Range be lower than the second error rate at the second boundary, or vice versa. Accordingly, the target ratio may have some value other than one. If the ratio is sufficiently close to the target ratio (i.e., if the ratio is within the threshold amount of the target ratio), read voltage adjustment component 113 can determine that the threshold criterion is satisfied.

Responsive to the correspondence between the first error rate and the second error rate satisfying the first threshold criterion, at operation 250, the processing logic maintains the read voltage level associated with the first range at a current level. Responsive to the correspondence between the first error rate to the second error rate not satisfying the first threshold criterion, at operation 260, the processing logic modifies the read voltage level associated with the first range. In one implementation, read voltage adjustment component 113 can adjust the read voltage level to cause the ratio of the first error rate to the second error rate to satisfy the first threshold criterion. This can include for example, either increasing or decreasing the read voltage level by a certain amount, re-measuring the error rates at each boundary, and determining whether the ratio is brought closer to the target ratio. Read voltage adjustment component 113 can repeat this iterative process until the threshold criterion is satisfied. Once the appropriate modified read voltage level is determined, read voltage adjustment component 113 can store this read voltage level for use with future read operations directed to data having a W2R delay that falls within the corresponding range.

Figure 4:
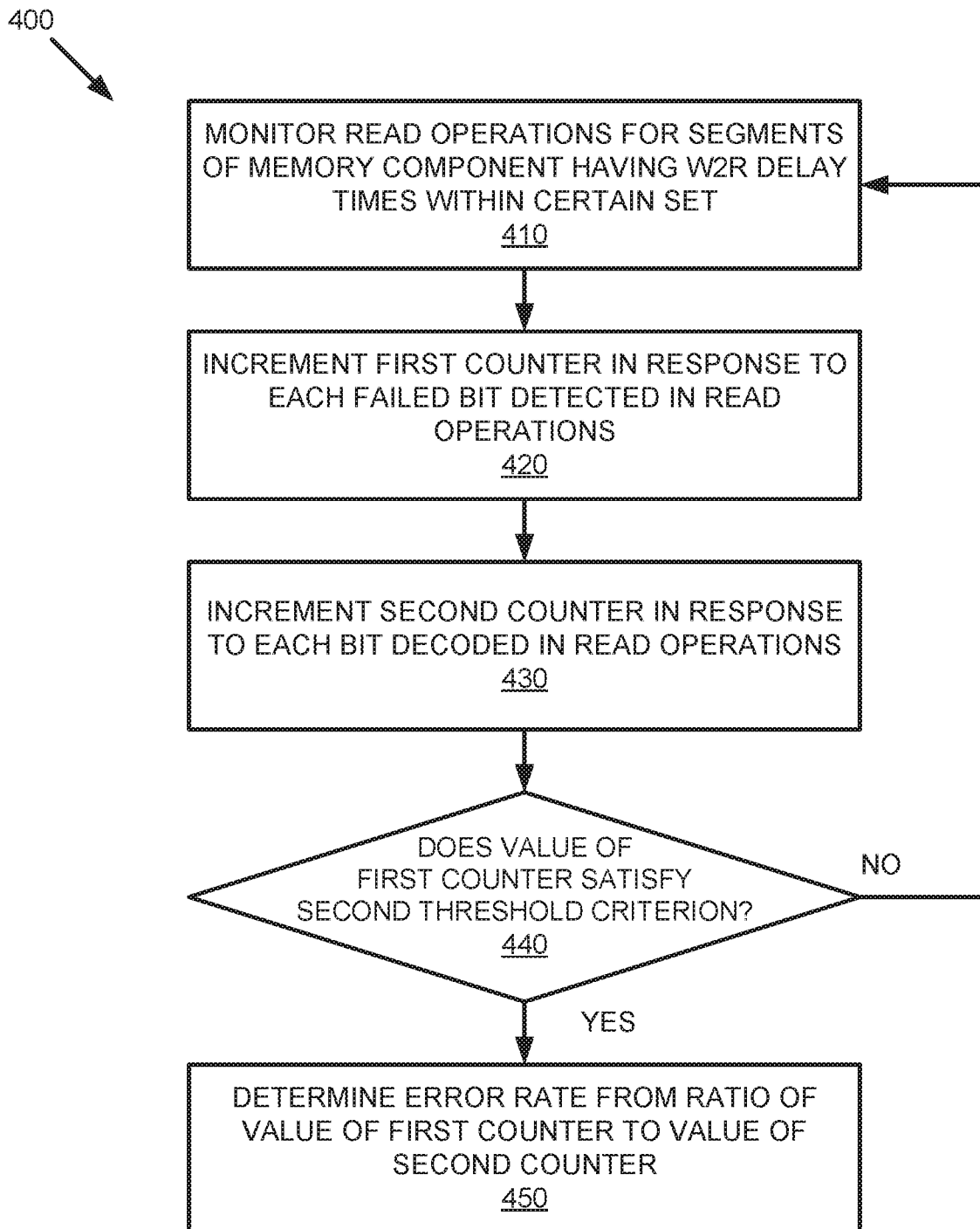
FIG. 4 is a flow diagram of an example method of determining an error rate for a set of write-to-read delay times at a boundary of a range of write-to-read delay times in accordance with some embodiments of the present disclosure.

FIG. 4 is a flow diagram of an example method of determining an error rate for a set of write-to-read delay times at a boundary of a range of write-to-read delay times in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic monitors read operations performed on segments of the memory component having write-to-read delay times that fall within the first set (e.g., 314 and/or 316) of the plurality of write-to-read delay times. In one implementation, read voltage adjustment component 113 can receive requests to perform read operations from host system 120, perform any address mapping operations to identify the physical address in memory to which the read operation is directed, and determine the corresponding W2R delay time for that address. The W2R delay time can represent a difference between a first time when the data was written to the physical address and a second time when the read request was received from the host system 120. Depending on the implementation, the W2R delay time can be calculated based on the difference between current time and a time stamp (indicating write time) which can be stored either with the data at the physical address on the memory component or in some other data store separate from the memory component (e.g., in local memory 119), or can be otherwise calculated by read voltage adjustment component 113. In another implementation, actual read operations are not received from host system 120, but rather read voltage adjustment component 113 can intentionally issue requests to read data known to have the appropriate W2R delay time. Although the operations of method 400 are described with respect to a first set (e.g., 314) of W2R delay times of a first range (e.g., W2R Range 310), the same or similar operations may be performed for a different set (e.g., 316) or for a different range (e.g., W2R Range 320 or 330).

At operation 420, the processing logic increments a first counter of counters 118 in response to each failed bit detected in the read operations. For reads that fall within the identified set 314, read voltage adjustment component 113 reads a raw code word, applies the code word to an error correcting code (ECC) decoder to generate a decoded code word and compares the decoded code word to the raw code word. Read voltage adjustment component 113 can increment the first counter in response to each bit that was flipped in the decoded code word. At operation 430, the processing logic increments a second counter of counters 118 in response to each bit in each code word that is decoded in the read operations.

At operation 440, the processing logic determines whether a value of the first counter satisfies a second threshold criterion pertaining to a sample size. In order to ensure that the determined error rate is statistically relevant and not merely an outlier, read voltage adjustment component 113 may continue to collect data until a threshold number of failed bits have been decoded, with the threshold number of failed bits representing a sufficient sample size. Once the threshold number has been reached, read voltage adjustment component 113 can determine that the second threshold criterion has been satisfied. Responsive to the value of the first counter satisfying the second threshold criterion, at operation 450, the processing logic determines the error rate from a ratio of a value of the first counter to the value of the second counter.

In one implementation, the operations of method 400 are performed twice in order to determine both the first and second boundary error rates described with respect to method 200. For example, the processing logic may determine perform the operations of method 400 once to determine the error rate corresponding to bits written at a first boundary 314 of a given write-to-read range 310 and again to determine the error rate corresponding to bits written at a second boundary 316 of the write-to-read range 310.

Figure 5:
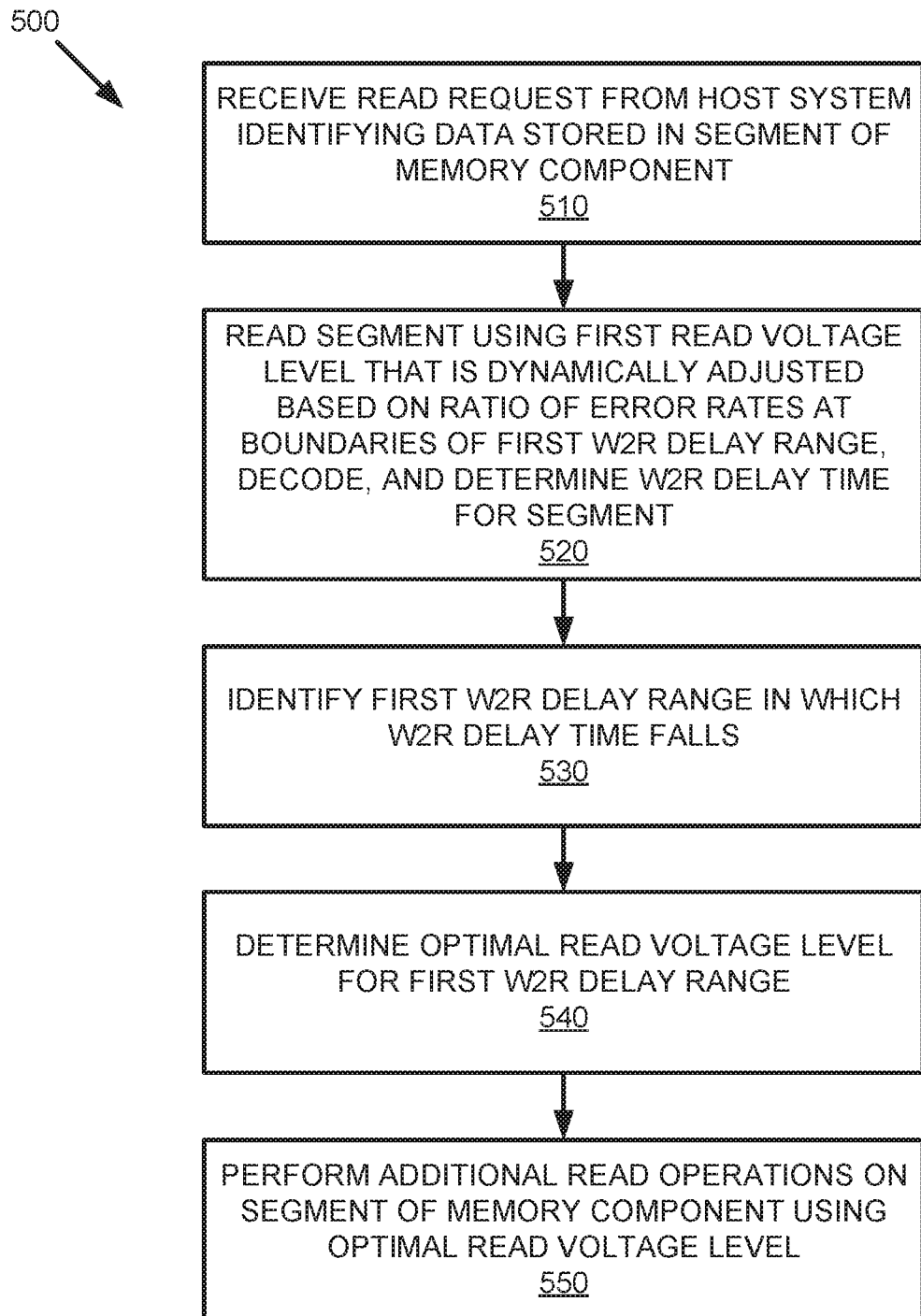
FIG. 5 is a flow diagram of an example method of performing a read operation using a dynamically adjusted read voltage level based on boundary error statistics in accordance with some embodiments of the present disclosure.

FIG. 5 is a flow diagram of an example method of performing a read operation using a dynamically adjusted read voltage level based on boundary error statistics in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a read request from a host system 120, or from some other component of the memory sub-system 110. In one implementation, the read request identifies data stored in a segment of a memory component. The segment may be any physical or logical portion of the memory component, such as a data block, for example.

At operation 520, the processing logic performs a read operation on the segment of the memory component using a first read voltage level, decodes the data stored at the segment, and determines a write-to-read delay time for the segment of the memory component in which the data identified in the request is stored. In one implementation, read voltage adjustment component uses the lowest read voltage level (e.g., Read Level 1) available in the memory sub-system by default to perform the read operation. If the data read using the first read voltage level can be successfully decoded, read voltage adjustment component 113 can read a time stamp stored with the data on the memory component indicating when the data was written to the segment. If the data read using the lowest read voltage level is not able to be successfully decoded, the processing logic may attempt to read the data again using a different read voltage level (e.g., Read Level 2). The processing logic may repeat this process until the data is able to be successfully decoded. Upon successfully decoding the data, read voltage adjustment component 113 can determine a difference between the write time indicated by the time stamp and the current time (or a time when the read request was received at operation 510), where that difference represents the W2R delay. In certain situations, the W2R delay may be ascertainable without reading the corresponding segment. For example, if a write timestamp is stored elsewhere, such as in local memory 119, or if controller 115 issues write and read operations with known intentional delay times between the write and read operations, read voltage adjustment component 113 can determine the W2R delay before reading the segment. In these cases, read voltage adjustment component 113 can perform the read operation using a different read voltage level (e.g., Read Level 2 or Read Level 3) corresponding to the known W2R delay. In one implementation, whether the first read voltage level is Read Level 1, Read Level 2, or Read Level 3, the read voltage level is dynamically adjusted based on a correspondence between a first error rate measured at a first boundary of the first range and a second error rate measured at a second boundary of the first range. In one implementation, the actual value of the read voltage level can be adjusted according to the process described above with respect to FIG. 2.

At operation 530, the processing logic identifies a first range of a plurality of write-to-read delay ranges for the memory component, wherein the first range represents a plurality of write-to-read delay times, and wherein the write-to-read delay time for the segment falls within the first range. At operation 540, the processing logic determines an optimal read voltage level to be used to perform a read operation on segments of the memory component having write-to-read delay times that fall within the first range, wherein the optimal read voltage level is dynamically adjusted based on a correspondence between a first error rate measured at a first boundary of the first range and a second error rate measured at a second boundary of the first range. For example, for a W2R delay time that falls within W2R range 310, read voltage adjustment component can determine the corresponding optimal read voltage level (i.e., Read Level 1) from a data structure, mapping table, register, etc.

At operation 550, the processing logic optionally performs any additional read operations on the segment of the memory component using the optimal read voltage level determined at operation 540. In one embodiment, performing the read operation can include applying a signal with the determined read voltage level to one or more memory cells to be read and determining a state of the memory cells, where this state can be decoded to provide the data stored therein.

Figure 6:
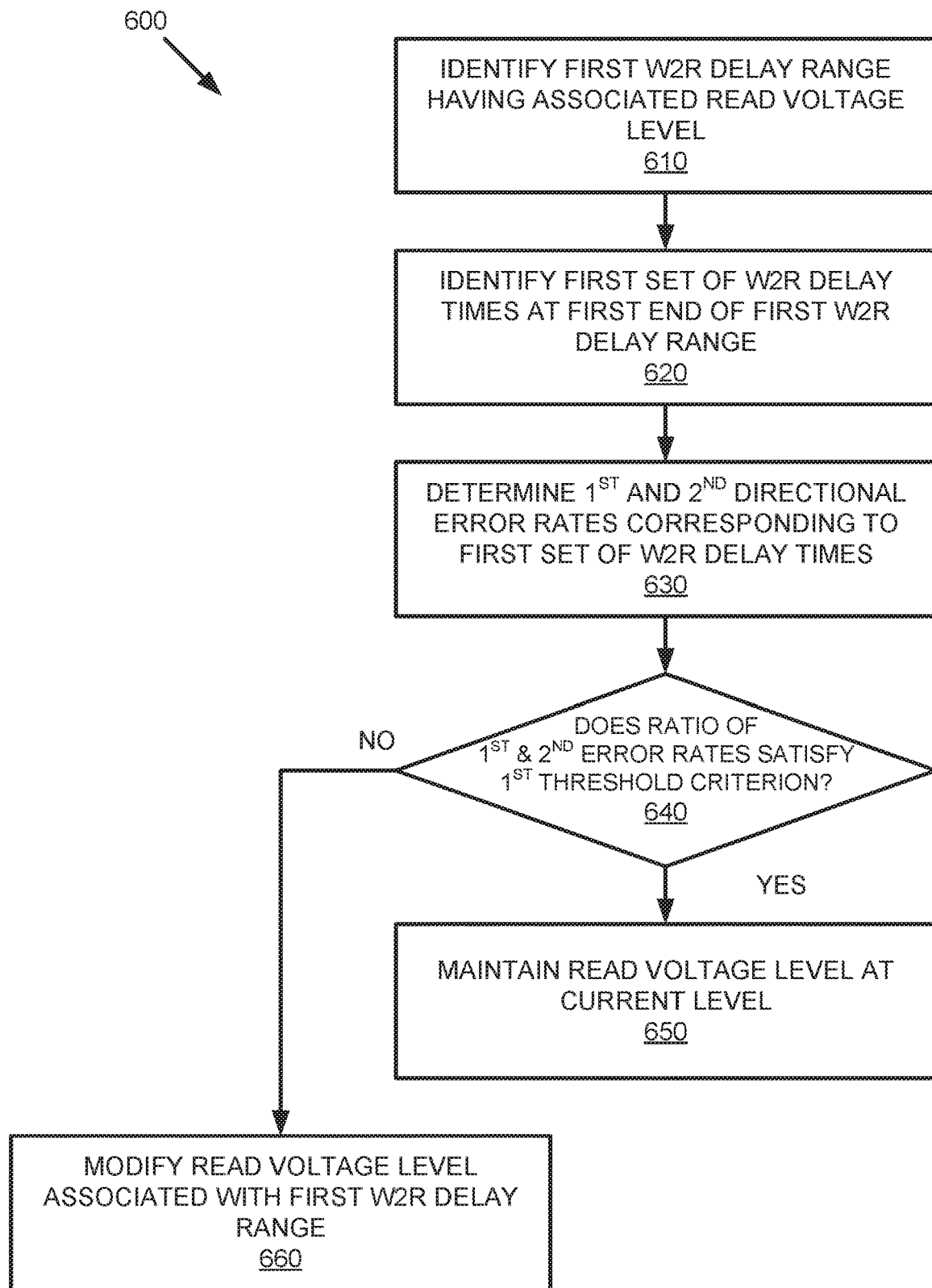
FIG. 6 is a flow diagram of an example method of adjusting a read voltage level based on accumulated directional RBER statistics for memories with time-varying error rates in accordance with some embodiments of the present disclosure.

FIG. 6 is a flow diagram of an example method of adjusting a read voltage level based on accumulated directional RBER statistics for memories with time-varying error rates in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic identifies a first range (e.g., W2R Range 310) of a plurality of write-to-read delay ranges for the memory component, wherein the first range represents a plurality of write-to-read delay times and has an associated read voltage level (e.g., Read Level 1) used to perform a read operation on a segment of the memory component having a write-to-read delay time that falls within the first range, as shown in FIG. 3A. The values of Read Level 1, Read Level 2, and Read Level 3 may be set during production of the memory component, but due to the passage of time and other factors associated with use of the memory component, may become sub-optimal at some point. Adjusting the read voltage levels based on accumulated directional RBER statistics can bring those read voltage levels back to a point where the BER is optimized (or at least reduced) for a corresponding range of W2R delay times.

Figure 7:
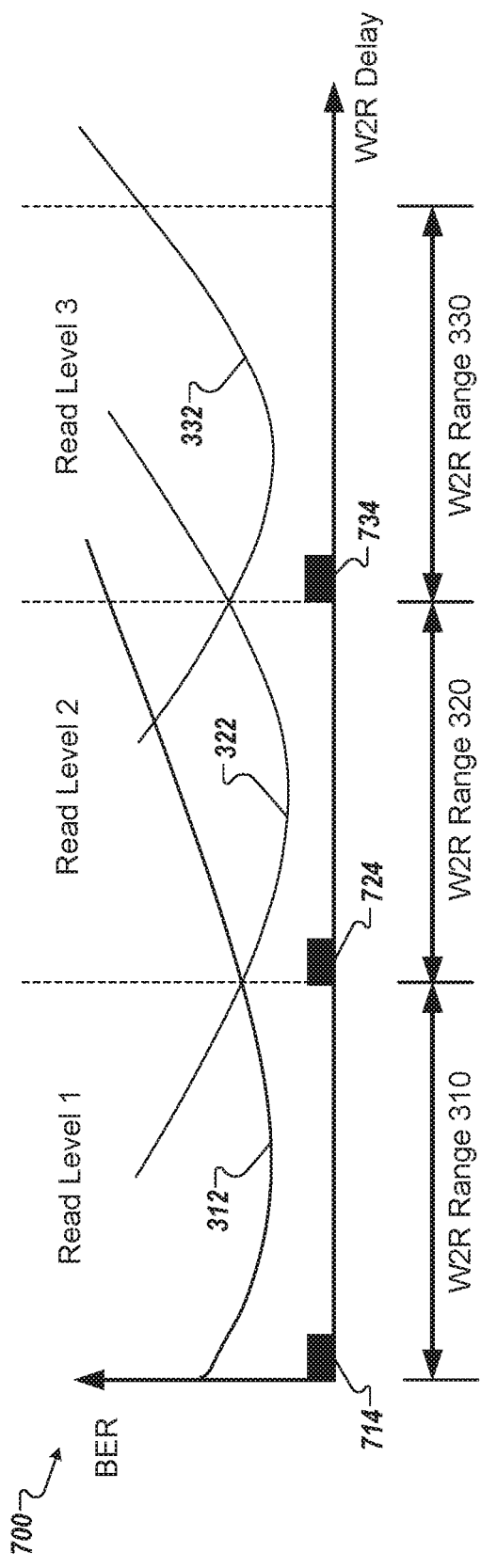
FIG. 7 is a graph that illustrates the accumulated directional raw bit error rate statistics for memories with time-varying error rates in accordance with some embodiments of the present disclosure.

Referring again to FIG. 6, at operation 620, the processing logic identifies a first set 714 of the plurality of write-to-read delay times at a first end (i.e., boundary) of the first range (i.e., W2R Range 310), as illustrated in FIG. 7. FIG. 7 is a graph 700 that illustrates the accumulated directional RBER statistics for memories with time-varying error rates in accordance with some embodiments of the present disclosure. In one implementation, the first set 714 includes a small set of the lowest W2R delay times in W2R Range 710. W2R Range 320 may similarly have a first set 724, and W2R Range 330 may have a first set 734. The size of the first set 714 can be a configurable parameter and can include a fixed number of W2R delay times (e.g., the 5 lowest W2R delay times in W2R Range 310) or a percentage of all the W2R delay times in W2R Range 310 (e.g., the lowest 1%). In one implementation, the boundary between W2R Range 310 and W2R Range 320 can be set according to a point where curve 312 and curve 322 intersect, and the boundary between W2R Range 320 and W2R Range 330 can be set according to a point where curve 322 and curve 332 intersect. Since the error rates can change over time due to physical changes to the associated memory cells, wear level, temperature, etc., these boundaries can also shift over time in order to optimize the BER. In addition, changing system design targets can also impact the location of these boundaries.

Referring again to FIG. 6, at operation 630, the processing logic determines a first directional error rate for the memory component corresponding to the first set 714 of the plurality of write-to-read delay times and a second directional error rate for the memory component corresponding to the first set 714 of the plurality of write-to-read delay times. In one implementation, the directional error rate pertains to a number of bits programmed in a first state and erroneously read as a second state. Accordingly, the first error rate can pertain, for example, to the number of bits written as a logical '0' and erroneously read as a logical '1', divided by the total number of logical '0' bits written in the measured segment. Similarly, the second error rate can pertain, for example, to the number of bits written as a logical '1' and erroneously read as a logical '0', divided by the total number of logical '1' bits written in the measured segment. In other implementations, the first error rate and the second error rate can be reversed. In another implementation, the processing logical determines the directional failed bit counts, rather than the corresponding directional error rates.

In one implementation, read voltage adjustment component 113 performs a data integrity scan of the memory component to determine an error rate for each segment (e.g., a data block). During the scan, read voltage adjustment component 113 identifies one or more reliability statistics, such as the directional error rates. In one embodiment, during the scan, read voltage adjustment component 113 writes and reads a raw code word (i.e., a series of a fixed number of bits) from the data block, with a controlled W2R delay falling into the first set 714. Read voltage adjustment component 113 can apply the code word to an error correcting code (ECC) decoder to generate a decoded code word and compare the decoded code word to the raw code word. Read voltage adjustment component 113 can count a number of flipped bits between the decoded code word and the raw code word, further obtaining the directional error rates of both directions. Read voltage adjustment component 113 can repeat this process for additional code words until the entire block has been scanned. In another implementation, read voltage adjustment component 113 can utilize various counters 118 to determine the error rate, as described in more detail with respect to FIG. 8.

At operation 640, the processing logic determines whether a correspondence between the first directional error rate and the second directional error rate satisfies a first threshold criterion. In one implementation, read voltage adjustment component 113 determines a ratio of the first directional error rate to the second directional error rate and compares that ratio to a target ratio. In one implementation, the target ratio may be one, such that it is desirable for the first directional error rate to be as close as possible to the second directional error rate. Accordingly, read voltage adjustment component 113 can compare the first directional error rate to the second directional error rate and determine whether the first directional error rate is within a threshold amount of the second directional error rate. If the ratio is sufficiently close to one (i.e., if the difference between the first directional error rate and the second directional error rate is within the threshold amount), read voltage adjustment component 113 can determine that the threshold criterion is satisfied. In other implementations, the target ratio may be some other value set in view of desired reliability and performance requirements of the memory sub-system. For example, in some situations, it may be desirable that the first directional error rate be lower than the second directional error rate, or vice versa. Accordingly, the target ratio may have some value other than one. If the ratio is sufficiently close to the target ratio (i.e., if the ratio is within the threshold amount of the target ratio), read voltage adjustment component 113 can determine that the threshold criterion is satisfied.

Responsive to the correspondence between the first directional error rate and the second directional error rate satisfying the first threshold criterion, at operation 650, the processing logic maintains the read voltage level associated with the first range at a current level. Responsive to the correspondence between the first directional error rate and the second directional error rate not satisfying the first threshold criterion, at operation 660, the processing logic modifies the read voltage level associated with the first range. In one implementation, read voltage adjustment component 113 can adjust the read voltage level to cause the ratio of the first directional error rate to the second directional error rate to satisfy the first threshold criterion. This can include for example, either increasing or decreasing the read voltage level by a certain amount, re-measuring the directional error rates, and determining whether the ratio is brought closer to the target ratio. Read voltage adjustment component 113 can repeat this iterative process until the threshold criterion is satisfied. Once the appropriate modified read voltage level is determined, read voltage adjustment component 113 can store this read voltage level for use with future read operations directed to data having a W2R delay that falls within the corresponding range.

Figure 8:
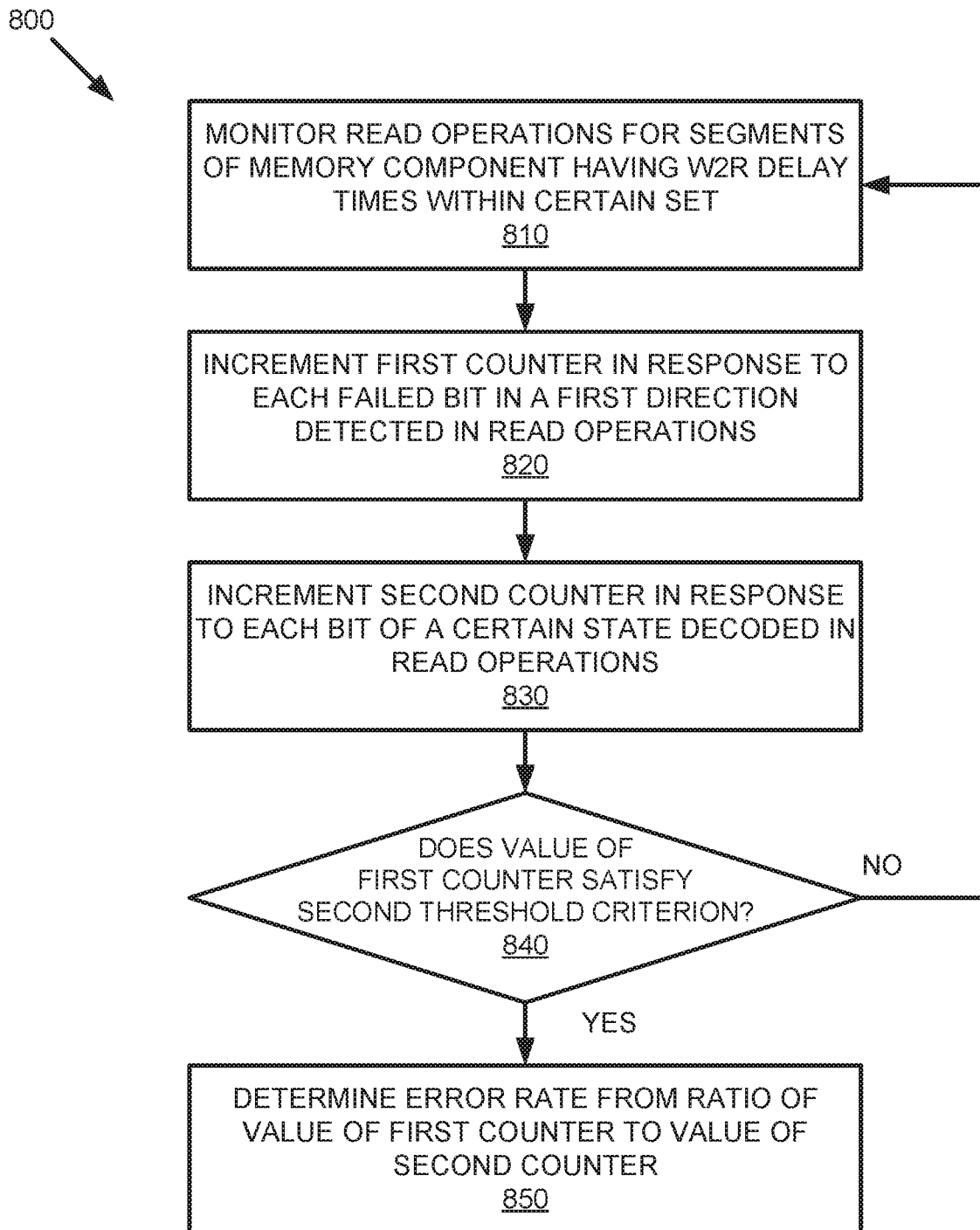
FIG. 8 is a flow diagram of an example method of determining a directional error rate for a set of write-to-read delay times of a range of write-to-read delay times in accordance with some embodiments of the present disclosure.

FIG. 8 is a flow diagram of an example method of determining a directional error rate for a set of write-to-read delay times at a boundary of a range of write-to-read delay times in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic monitors read operations performed on segments of the memory component having write-to-read delay times that fall within the first set of the plurality of write-to-read delay times. In one implementation, read voltage adjustment component 113 can receive requests to perform read operations from host system 120, perform any address mapping operations to identify the physical address in memory to which the read operation is directed, and determine the corresponding W2R delay time for that address. The W2R delay time can represent a difference between a first time when the data was written to the physical address and a second time when the read request was received from the host system 120. Depending on the implementation, the W2R delay time can be calculated based on the difference between current time and a time stamp (indicating write time) which can be stored either with the data at the physical address on the memory component or in some other data store separate from the memory component (e.g., in local memory 119), or can be otherwise calculated by read voltage adjustment component 113. In another implementation, actual read operations are not received from host system 120, but rather read voltage adjustment component 113 can intentionally issue requests to read data known to have the appropriate W2R delay time. Although the operations of method 800 are described with respect to errors occurring in a first direction for a first set (e.g., 714) of W2R delay times of a first range (e.g., W2R Range 310), the same or similar operations may be performed for a different set (e.g., 724 or 734) or for a different range (e.g., W2R Range 320 or 330).

At operation 820, the processing logic increments a first counter of counters 118 in response to each failed bit in a first direction detected in the read operations. For reads that fall within the identified set 714, read voltage adjustment component 113 reads a raw code word, applies the code word to an error correcting code (ECC) decoder to generate a decoded code word and compares the decoded code word to the raw code word. Read voltage adjustment component 113 can increment the first counter in response to each bit that was flipped in a particular direction in the decoded code word. For example, read voltage adjustment component 113 can increment the first counter for each bit written as a logical '0' and erroneously read as a logical '1'. In another implementation, read voltage adjustment component 113 can instead increment the first counter for each bit written as a logical '1' and erroneously read as a logical '0'. At operation 830, the processing logic increments a second counter of counters 118 in response to each bit of a certain state (i.e., the directional state determined at operation 820) in the decoded code word. For example, in one implementation where the first counter corresponds to the direction error of data written as a logical '0' and erroneously read as a logical '1', at operation 830, the second counter will accumulate in response to each bit having the state of a logical '0' in the decoded code word.

At operation 840, the processing logic determines whether a value of the first counter satisfies a second threshold criterion pertaining to a sample size. In order to ensure that the determined error rate is statistically relevant and not merely an outlier, read voltage adjustment component 113 may continue to collect data until a threshold number of directional failed bit counts have been decoded, with the threshold number of directional failed bit counts representing a sufficient sample size. Once the threshold number has been reached, read voltage adjustment component 113 can determine that the second threshold criterion has been satisfied. Responsive to the value of the first counter satisfying the second threshold criterion, at operation 850, the processing logic determines the directional error rate from a ratio of a value of the first counter to the value of the second counter.

In one implementation, the operations of method 800 are performed twice in order to determine both the first and second directional error rates described with respect to method 600. For example, the processing logic may determine perform the operations of method 800 once to determine the directional error rate corresponding to bits written as a logical '0' and erroneously read as a logical '1' and again to determine the directional error rate corresponding to bits written as a logical '1' and erroneously read as a logical '0'. In one implementation, the ratio of the first and second directional error rates is determined at operation 640 of method 600 responsive to there being a sufficient sample size pertaining to both the first and second directional error rates, as determined at operation 840. As the number of decoded code words for directional failed bit accumulation increases, the balance between the number of logical '0' and logical '1' bits improves. Accordingly, the first threshold criterion used in operation 640 of method 600 can be determined according to the number of failed bits in each direction described above with respect to operation 820 of method 800.

Figure 9:
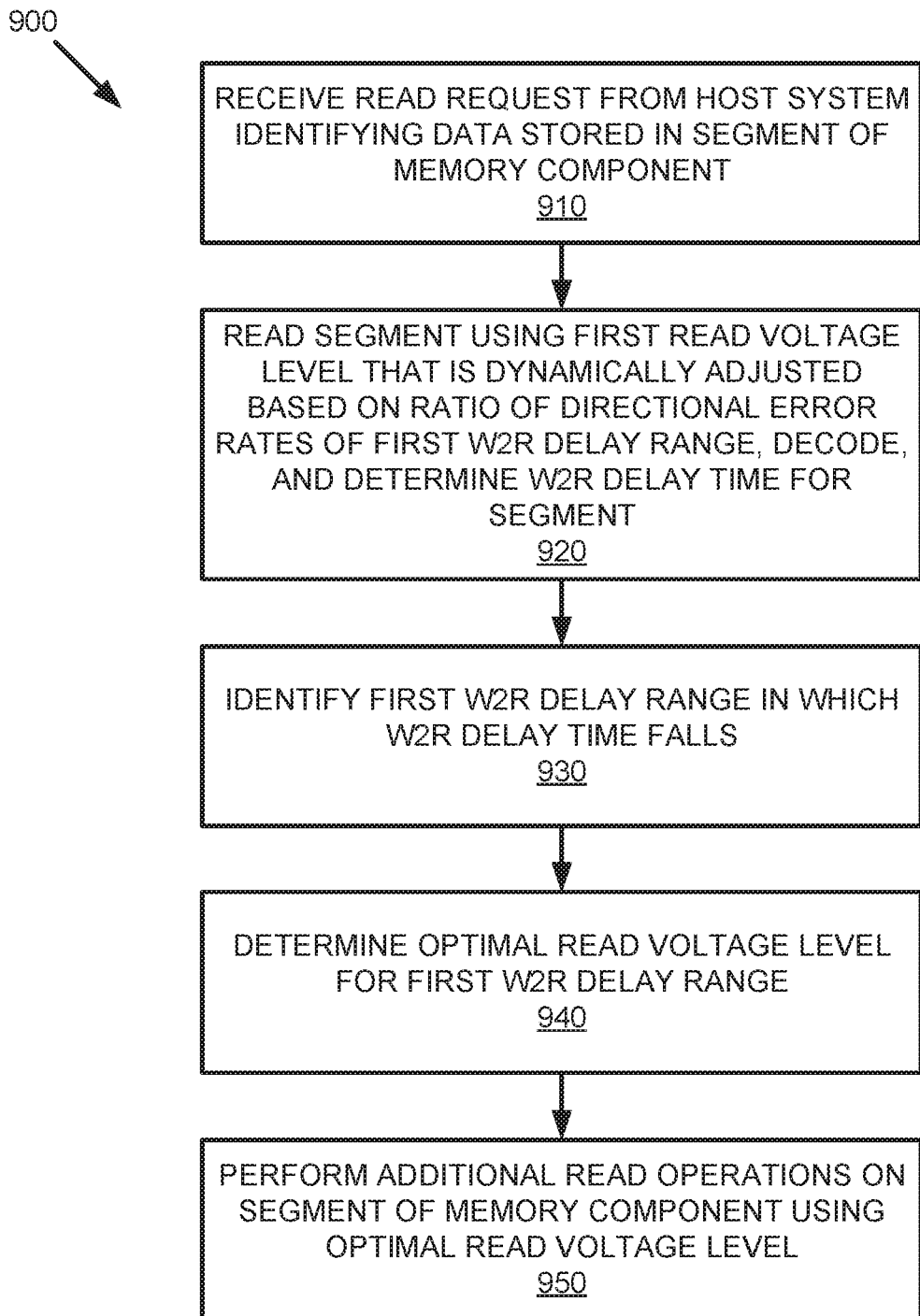
FIG. 9 is a flow diagram of an example method of performing a read operation using a dynamically adjusted read voltage level based on directional error statistics in accordance with some embodiments of the present disclosure.

FIG. 9 is a flow diagram of an example method of performing a read operation using a dynamically adjusted read voltage level based on directional error statistics in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing logic receives a read request from a host system 120, or from some other component of the memory sub-system 110. In one implementation, the read request identifies data stored in a segment of a memory component. The segment may be any physical or logical portion of the memory component, such as a data block, for example.

At operation 920, the processing logic performs a read operation on the segment of the memory component using a first read voltage level (e.g., Read Level 1), decodes the data stored at the segment, and determines a write-to-read delay time for the segment of the memory component in which the data identified in the request is stored. In one implementation, read voltage adjustment component uses the lowest read voltage level (e.g., Read Level 1) available in the memory sub-system by default to perform the read operation. If the data read using the first read voltage level can be successfully decoded, read voltage adjustment component 113 can read a time stamp stored with the data on the memory component indicating when the data was written to the segment. If the data read using the lowest read voltage level is not able to be successfully decoded, the processing logic may attempt to read the data again using a different read voltage level (e.g., Read Level 2). The processing logic may repeat this process until the data is able to be successfully decoded. Upon successfully decoding the data, read voltage adjustment component 113 can determine a difference between the write time indicated by the time stamp and the current time (or a time when the read request was received at operation 910), where that difference represents the W2R delay. In certain situations, the W2R delay may be ascertainable without reading the corresponding segment. For example, if a write timestamp is stored elsewhere, such as in local memory 119, or if controller 115 issues write and read operations with known intentional delay times between the write and read operations, read voltage adjustment component 113 can determine the W2R delay before reading the segment. In these cases, read voltage adjustment component 113 can perform the read operation using a different read voltage level (e.g., Read Level 2 or Read Level 3) corresponding to the known W2R delay. In one implementation, whether the first read voltage level is Read Level 1, Read Level 2, or Read Level 3, the read voltage level is dynamically adjusted based on a correspondence between a first directional error rate measured at a first boundary of the first range and a second error directional rate measured at the first boundary of the first range. In one implementation, the actual value of the read voltage level can be adjusted according to the process described above with respect to FIG. 6.

At operation 930, the processing logic identifies a first range of a plurality of write-to-read delay ranges for the memory component, wherein the first range represents a plurality of write-to-read delay times, and wherein the write-to-read delay time for the segment falls within the first range. At operation 940, the processing logic determines an optimal read voltage level to be used to perform a read operation on segments of the memory component having write-to-read delay times that fall within the first range, wherein the optimal read voltage level is dynamically adjusted based on a correspondence between a first directional error rate measured at a first boundary of the first range and a second error directional rate measured at the first boundary of the first range. For example, for a W2R delay time that falls within W2R range 320, read voltage adjustment component can determine the corresponding optimal read voltage level (i.e., Read Level 2) from a data structure, mapping table, register, etc.

At operation 950, the processing logic optionally performs any additional read operations on the segment of the memory component using the optimal read voltage level determined at operation 940. In one embodiment, performing the read operation can include applying a signal with the determined read voltage level to one or more memory cells to be read and determining a state of the memory cells, where this state can be decoded to provide the data stored therein.

Figure 10:
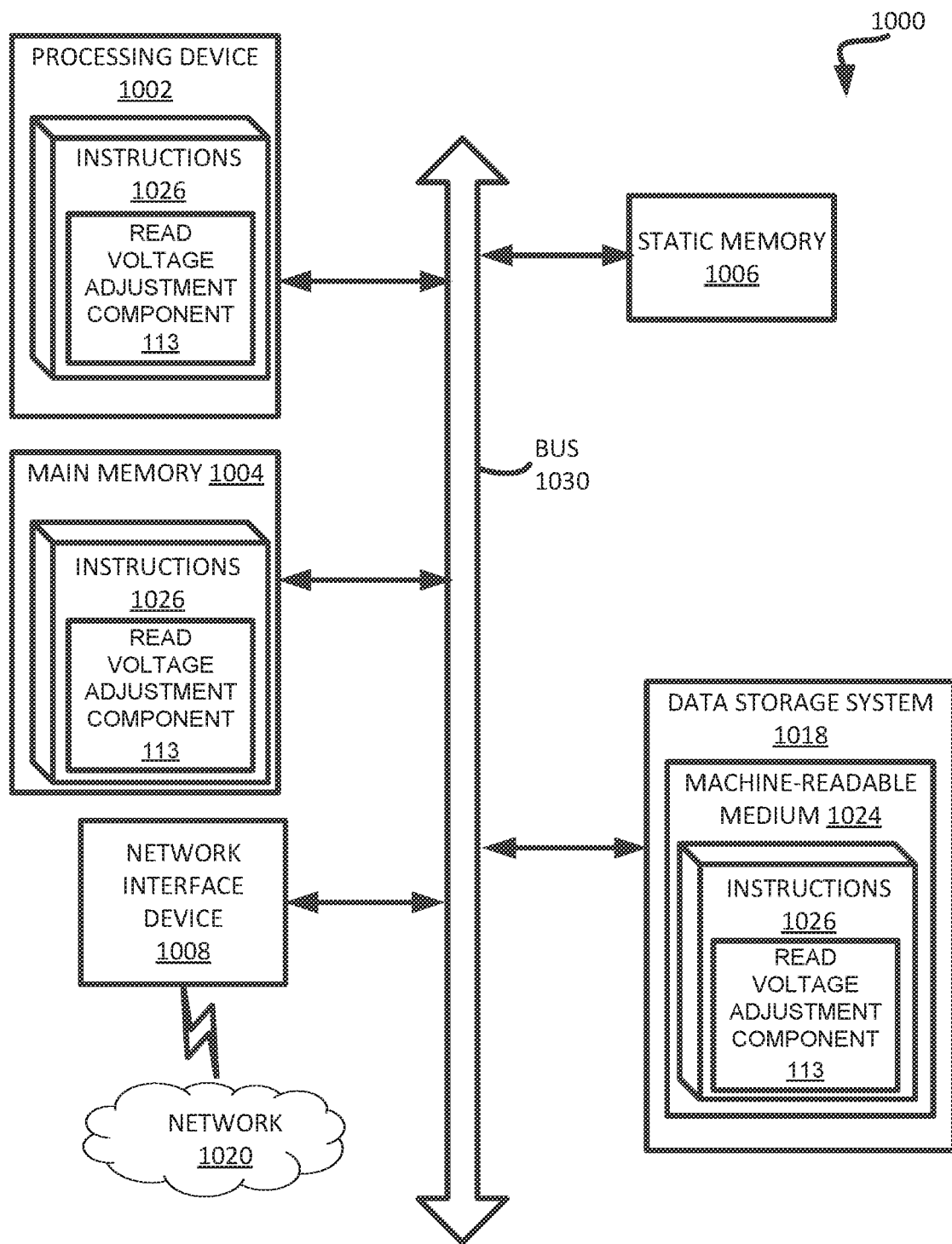
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read voltage adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to the read voltage adjustment component 113 of FIG. 1. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory component; and
   a processing device, operatively coupled with the memory component, to:
      identify a range of a plurality of write-to-read delay ranges for the memory component, wherein the range represents a plurality of write-to-read delay times and has an associated read voltage level used to perform a read operation on a segment of the memory component having a write-to-read delay time that falls within the range;
      identify a first set of the plurality of write-to-read delay times at a first end of the range and a second set of the plurality of write-to-read delay times at a second end of the range, wherein the first set comprises different write-to-read delay times than the second set;
      determine a first error rate for the memory component corresponding to the first set of the plurality of write-to-read delay times and a second error rate for the memory component corresponding to the second set of the plurality of write-to-read delay times;
      determine whether a correspondence between the first error rate and the second error rate satisfies a first threshold criterion; and
      responsive to the correspondence between the first error rate and the second error rate not satisfying the first threshold criterion, modify the read voltage level associated with the range.

2. The system of claim 1, wherein to determine the first error rate, the processing device is to:
   monitor read operations performed on segments of the memory component having write-to-read delay times that fall within the first set of the plurality of write-to-read delay times;
   increment a first counter in response to each failed bit detected in the read operations;
   increment a second counter in response to each bit in each code word that is decoded in the read operations;
   determine that a value of the first counter satisfies a second threshold criterion pertaining to a sample size; and
   determine a ratio of a value of the first counter to a value of the second counter.

3. The system of claim 1, wherein to determine whether the correspondence between the first error rate and the second error rate satisfies the first threshold criterion, the processing device is to determine whether the first error rate is within a threshold amount of the second error rate.

4. The system of claim 1, wherein to determine whether the correspondence between the first error rate and the second error rate satisfies the first threshold criterion, the processing device is to determine whether a ratio of the first error rate to the second error rate is within a threshold amount of a target ratio.

5. The system of claim 4, wherein the target ratio is based on desired reliability and performance requirements of the system.

6. The system of claim 1, wherein to modify the read voltage level associated with the range, the processing device is to adjust the read voltage level to cause the correspondence between the first error rate and the second error rate to satisfy the first threshold criterion.

7. The system of claim 1, wherein the processing device is further to:
   responsive to the correspondence between the first error rate and the second error rate satisfying the first threshold criterion, maintain the read voltage level associated with the range at a current level.

8. A method of operation of a memory sub-system comprising:
   receiving a read request from a host system, the read request identifying data stored in a segment of a memory component;
   performing a read operation on the segment of the memory component using a first read voltage level;
   determining, based on the read operation, a write-to-read delay time for the segment of the memory component in which the data identified in the request is stored;
   identifying a range of a plurality of write-to-read delay ranges for the memory component, wherein the range represents a plurality of write-to-read delay times, and wherein the write-to-read delay time for the segment falls within the range; and
   determining a second read voltage level used to perform read operations on the segment of the memory component, wherein the second read voltage level is dynamically adjusted based on a correspondence between a first error rate measured at a first boundary of the range and a second error rate measured at a second boundary of the range, wherein the first boundary represents a different write-to-read delay time than the second boundary.

9. The method of claim 8, wherein the write-to-read delay time represents a difference between a first time when the data was written to the segment and a second time when the read request identifying the data was received from the host system.

10. The method of claim 8, wherein determining the second read voltage level comprises:
    identifying a first set of the plurality of write-to-read delay times at the first boundary of the range and a second set of the plurality of write-to-read delay times at the second boundary of the range;
    determining the first error rate for the memory component corresponding to the first set of the plurality of write-to-read delay times and the second error rate for the memory component corresponding to the second set of the plurality of write-to-read delay times; and
    determining the correspondence between the first error rate and the second error rate.

11. The method of claim 10, further comprising:
    dynamically adjusting the second read voltage level responsive to the correspondence between the first error rate and the second error rate not satisfying the first threshold criterion.

12. The method of claim 11, wherein the correspondence between the first error rate and the second error rate satisfies the first threshold criterion when the first error rate is within a threshold amount of the second error rate.

13. The method of claim 11, wherein the correspondence between the first error rate and the second error rate satisfies the first threshold criterion when a ratio of the first error rate to the second error rate is within a threshold amount of a target ratio, and wherein the target ratio is based on desired reliability and performance requirements of the memory sub-system.

14. A non-transitory computer-readable storage medium comprising instructions that, when executed by a processing device, cause the processing device to:
identify a range of a plurality of write-to-read delay ranges for a memory component in a memory sub-system, wherein the range represents a plurality of write-to-read delay times and has an associated read voltage level used to perform a read operation on a segment of the memory component having a write-to-read delay time that falls within the range;
identify a first set of the plurality of write-to-read delay times at a first end of the range and a second set of the plurality of write-to-read delay times at a second end of the range, wherein the first set comprises different write-to-read delay times than the second set;
determine a first error rate for the memory component corresponding to the first set of the plurality of write-to-read delay times and a second error rate for the memory component corresponding to the second set of the plurality of write-to-read delay times;
determine whether a correspondence between the first error rate and the second error rate satisfies a first threshold criterion; and
responsive to the correspondence between the first error rate and the second error rate not satisfying the first threshold criterion, modify the read voltage level associated with the range.

15. The non-transitory computer-readable storage medium of claim 14, wherein to determine the first error rate, the instructions further cause the processing device to:
monitor read operations performed on segments of the memory component having write-to-read delay times that fall within the first set of the plurality of write-to-read delay times;
increment a first counter in response to each failed bit detected in the read operations;
increment a second counter in response to each bit in each code word that is decoded in the read operations;
determine that a value of the first counter satisfies a second threshold criterion pertaining to a sample size; and
determine a ratio of a value of the first counter to a value of the second counter.

16. The non-transitory computer-readable storage medium of claim 14, wherein to determine whether the correspondence between the first error rate and the second error rate satisfies the first threshold criterion, the instructions further cause the processing device to determine whether the first error rate is within a threshold amount of the second error rate.

17. The non-transitory computer-readable storage medium of claim 14, wherein to determine whether the correspondence between the first error rate and the second error rate satisfies the first threshold criterion, the instructions further cause the processing device to determine whether a ratio of the first error rate to the second error rate is within a threshold amount of a target ratio.

18. The non-transitory computer-readable storage medium of claim 17, wherein the target ratio is based on desired reliability and performance requirements of the memory sub-system.

19. The non-transitory computer-readable storage medium of claim 14, wherein to modify the read voltage level associated with the range, the instructions further cause the processing device to adjust the read voltage level to cause the correspondence between the first error rate and the second error rate to satisfy the first threshold criterion.

20. The non-transitory computer-readable storage medium of claim 14, wherein the instructions further cause the processing device to:
responsive to the correspondence between the first error rate and the second error rate satisfying the first threshold criterion, maintain the read voltage level associated with the range at a current level.

* * * * *